(12) United States Patent
Ishikura et al.

(10) Patent No.: US 12,537,444 B2
(45) Date of Patent: Jan. 27, 2026

(54) SWITCHING POWER SUPPLY DEVICE

(71) Applicant: Murata Manufacturing Co., Ltd., Kyoto-fu (JP)

(72) Inventors: Yuki Ishikura, Nagaokakyo (JP); Tatsuya Hosotani, Nagaokakyo (JP); Hiroyuki Takatsuji, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 224 days.

(21) Appl. No.: 18/399,221

(22) Filed: Dec. 28, 2023

(65) Prior Publication Data
US 2024/0136925 A1 Apr. 25, 2024
US 2024/0235394 A9 Jul. 11, 2024

Related U.S. Application Data

(63) Continuation of application No. PCT/JP2022/024789, filed on Jun. 22, 2022.

(30) Foreign Application Priority Data

Jun. 30, 2021 (JP) .................................. 2021-108318

(51) Int. Cl.
*H02M 1/44* (2007.01)
*H02M 3/00* (2006.01)
(Continued)

(52) U.S. Cl.
CPC .............. *H02M 1/44* (2013.01); *H02M 3/003* (2021.05); *H05K 1/0225* (2013.01); *H02M 1/14* (2013.01);
(Continued)

(58) Field of Classification Search
CPC .......... H02M 1/14; H02M 1/327; H02M 1/44; H02M 3/003; H02M 3/33569;
(Continued)

(56) References Cited

U.S. PATENT DOCUMENTS

2016/0204754 A1* 7/2016 Kawamura .......... H03H 1/0007
333/184
2016/0359417 A1* 12/2016 Odate ................... H02M 1/126
(Continued)

FOREIGN PATENT DOCUMENTS

JP H10107571 A * 4/1998
JP 2001217668 A * 8/2001
(Continued)

OTHER PUBLICATIONS

Machine translation of JP H10-107571. (Year: 1998).*
Machine translation of JP 2001-217668. (Year: 2001).*
Machine translation of JP 2005-294975. (Year: 2005).*
International Search Report issued in PCT/JP2022/024789; mailed Aug. 16, 2022.

*Primary Examiner* — Fred E Finch, III
(74) *Attorney, Agent, or Firm* — Studebaker Brackett PLLC (57) ABSTRACT

A circuit board of a switching power supply device includes a positive terminal circuit pattern and a negative terminal circuit pattern that are provided on a component mount surface and respectively supply currents from input parts to two input terminals of a common mode choke coil. The positive terminal circuit pattern and the negative terminal circuit pattern are positioned in parallel and close to each other. The component mount surface of the circuit board includes a component mount surface side ground pattern arranged below the common mode choke coil. A heat dissipation ground surface of the circuit board includes a ground pattern and a plurality of heat dissipation conductor patterns. Input terminals and output terminals of the common mode choke coil are respectively electrically and thermally connected to the heat dissipation conductor patterns via through-hole conductors provided between the component mount surface and the heat dissipation ground surface.

20 Claims, 7 Drawing Sheets

(51) Int. Cl.
  *H05K 1/02*  (2006.01)
  *H05K 1/18*  (2006.01)
  *H02M 1/14*  (2006.01)
  *H02M 1/32*  (2007.01)
  *H02M 3/335*  (2006.01)

(52) U.S. Cl.
  CPC ........ *H02M 1/327* (2021.05); *H02M 3/33569* (2013.01); *H05K 1/0206* (2013.01); *H05K 1/181* (2013.01)

(58) Field of Classification Search
  CPC .. H05K 1/0201–1/0206; H05K 1/0215; H05K 1/0224; H05K 1/0225; H05K 1/0227; H05K 1/023; H05K 1/0231; H05K 1/0233
  See application file for complete search history.

(56) References Cited

U.S. PATENT DOCUMENTS

2018/0007785 A1* 1/2018 Kamikura ............... H02M 7/48
2024/0235900 A1* 7/2024 Wachi .................. H05K 1/0245

FOREIGN PATENT DOCUMENTS

| JP | 2005294975 A | * | 10/2005 |
| JP | 2014-212623 A | | 11/2014 |
| JP | 2016-036219 A | | 3/2016 |
| JP | 2021-052138 A | | 4/2021 |
| KR | 10-2018-0082238 A | | 7/2018 |
| WO | 2016/147492 A1 | | 9/2016 |
| WO | 2020/116015 A1 | | 6/2020 |

* cited by examiner

< COMPONENT MOUNT SURFACE >

< HEAT DISSIPATION GROUND SURFACE >

SWITCHING POWER SUPPLY DEVICE

CROSS-REFERENCE TO RELATED APPLICATIONS

This application claims benefit of priority to International Patent Application No. PCT/JP2022/024789, filed Jun. 22, 2022, and to Japanese Patent Application No. 2021-108318, filed Jun. 30, 2021, the entire contents of each are incorporated herein by reference.

BACKGROUND

Technical Field

The present disclosure relates to a switching power supply device including an input part of an input power supply, a DC-DC converter, a noise reducing circuit, and a circuit board on which a ground pattern is provided.

Background Art

Japanese Unexamined Patent Application Publication No. 2014-212623 illustrates a switching power supply device that has a switching circuit, an isolation transformer, a rectifying part, and a filter part.

SUMMARY

In general, in a DC-DC converter including an isolation transformer, a steep voltage change is generated when a switching device is turned on or turned off, and a common mode noise current flows in an output line of direct-current voltage via a parasitic capacitance formed between a primary winding and a secondary winding of the isolation transformer. When this noise current reaches a low voltage battery connected to an output part or the like, there is a possibility of causing electromagnetic interference in another electronic device connected to this low voltage battery.

The foregoing noise current flows in a metal housing and a frame ground via a negative terminal of the output part. Further, because of a stray capacitance formed between the switching device and the metal housing, a steep voltage change is generated when the switching device is turned on or turned off, and a common mode noise current flows in the metal housing and the frame ground. When these noise currents reach a high voltage battery connected to an input part or the like via a stray capacitance formed between the frame ground and a wire harness or the like, there is a possibility of causing electromagnetic interference in another electronic device connected to this high voltage battery.

In the switching power supply device described in Japanese Unexamined Patent Application Publication No. 2014-212623, a common mode choke coil is provided in the direct-current input line as a countermeasure for the electromagnetic interference on the input part side, and a filter circuit made up of a choke coil and a capacitor is provided in the direct-current output line as a countermeasure for the electromagnetic interference on the output part side.

On the other hand, to increase the impedance of the common mode choke coil or the choke coil in a noise frequency band, it is necessary to increase the number of turns in the coil. However, this increases power loss due to copper loss caused by the winding wire of the coil and decreases the power conversion efficiency of the DC-DC converter. Further, as the power loss of the common mode choke coil increases, the temperature of the core that makes up the common mode choke coil becomes close to the Curie temperature, and in some cases, this may decrease the impedance of the common mode choke coil and increase EMI noise.

Accordingly, the present disclosure provides a switching power supply device that includes a DC-DC converter and a noise reducing circuit, the switching power supply device suppressing common mode noise generated by switching operation of a switching device and improving heat dissipation capability of a common mode choke coil that makes up the noise reducing circuit.

A switching power supply device that serves as an example of the present disclosure is a switching power supply device including an input part to which a direct-current input power supply is connected, a DC-DC converter, a noise reducing circuit, and a circuit board on which a ground pattern is provided. The DC-DC converter includes an input capacitor, a switching device, an isolation transformer, a rectifying device, and an output smoothing capacitor. The noise reducing circuit includes a first capacitor connected in parallel to the input part, a surface mount type common mode choke coil connected between the first capacitor and the input capacitor, second capacitors respectively electrically connected between two end portions of the input capacitor and the ground pattern, and an output filter having the output smoothing capacitor. The noise reducing circuit is provided between the input part and the input capacitor, and the input part to the DC-DC converter are arranged in a linear fashion on the circuit board. Two input terminals of the common mode choke coil are respectively electrically connected to a positive terminal and a negative terminal of the input part. Two output terminals of the common mode choke coil are respectively electrically connected to a positive terminal and a negative terminal of the input capacitor. The circuit board includes a component mount surface on which a component is mounted, a heat dissipation ground surface on which the ground pattern and a plurality of heat dissipation conductor patterns are formed, and through-hole conductors provided between the component mount surface and the heat dissipation ground surface. The circuit board includes a positive terminal circuit pattern and a negative terminal circuit pattern that are provided on the component mount surface and respectively cause currents to flow from the input part to the two input terminals of the common mode choke coil. The positive terminal circuit pattern and the negative terminal circuit pattern are positioned in parallel and close to one another. The component mount surface of the circuit board includes a component mount surface side ground pattern arranged below the common mode choke coil. The component mount surface side ground pattern is electrically and thermally connected to the ground pattern by the through-hole conductor. The ground pattern is electrically insulated from the heat dissipation conductor patterns. The two input terminals of the common mode choke coil are respectively electrically connected to the heat dissipation conductor patterns by the through-hole conductors, and the two output terminals of the common mode choke coil are respectively electrically connected to the heat dissipation conductor patterns by the through-hole conductors, the noise reducing circuit and the ground pattern make up a noise balanced circuit. The noise balanced circuit suppresses generation of common mode noise caused by switching operation of the switching device, and heat generated by the common mode choke coil is dissipated through the through-hole conductors, the ground pattern, and the heat dissipation conductor patterns.

According to the present disclosure, it becomes possible to obtain a switching power supply device that suppresses common mode noise generated by switching operation of the switching device and improves the heat dissipation capability against heat generated in the common mode choke coil that makes up the noise reducing circuit.

DETAILED DESCRIPTION

A plurality of embodiments for implementing the present disclosure is illustrated hereinafter with several specific examples while referring to the drawings. Same reference characters designate same parts throughout the drawings. In consideration of illustration of points and facilitation of understanding, a plurality of embodiments is described for the sake of convenience. However, constituent elements illustrated in different embodiments can be partially substituted or combined. In the description of the second embodiment and subsequent embodiments, descriptions regarding matters common to the first embodiment will not be repeated, and only points different from the first embodiment will be described. Particularly, similar actions and effects of similar constituent elements will not be repeated in each embodiment.

First Embodiment

Figure 1:
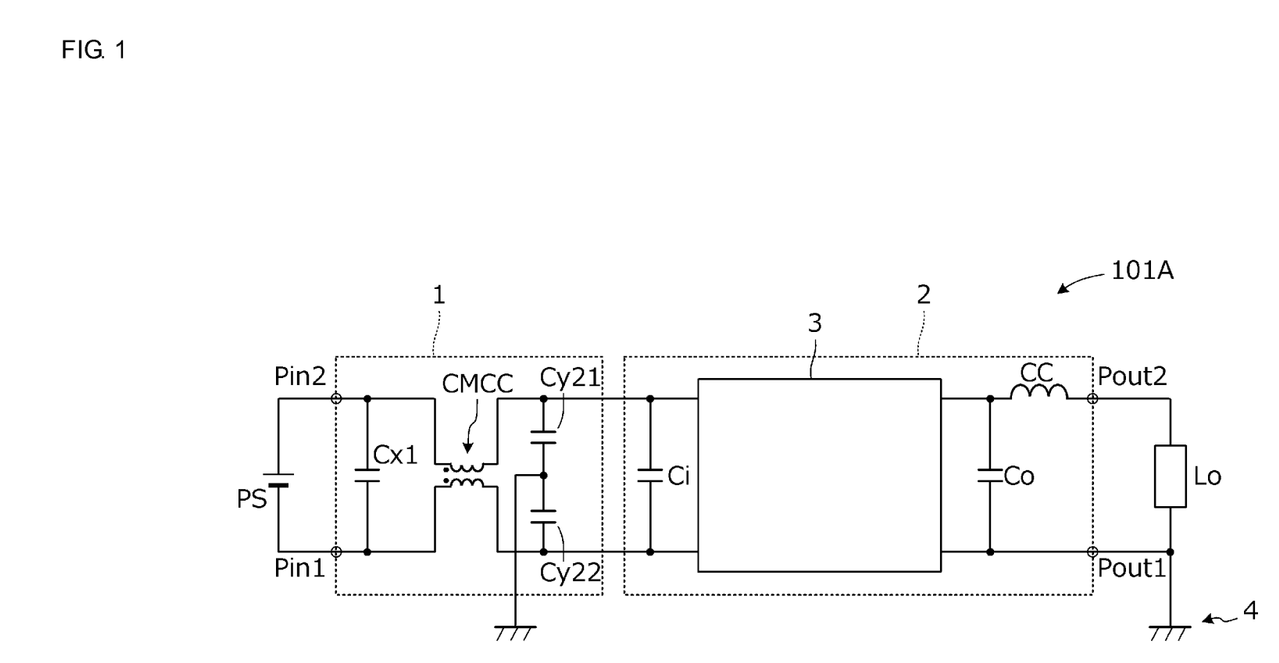
FIG. 1 is a circuit diagram of a switching power supply device 101A according to a first embodiment.

FIG. 1 is a circuit diagram of a switching power supply device 101A according to the first embodiment. The switching power supply device 101A includes input parts Pin1 and Pin2 for a direct-current input power supply PS, a DC-DC converter 2, a noise reducing circuit 1, and a circuit board on which a ground pattern 4 is provided.

The DC-DC converter 2 includes an input capacitor Ci, a switching circuit 3, an output smoothing capacitor Co, and a choke coil CC.

The noise reducing circuit 1 includes an X capacitor Cx1 connected in parallel to the input parts Pin1 and Pin2, a surface mount type common mode choke coil CMCC connected between the X capacitor Cx1 and the input capacitor Ci, and Y capacitors Cy21 and Cy22 that are respectively electrically connected between two end portions of the input capacitor Ci and the ground pattern 4.

The X capacitor Cx1 corresponds to a first capacitor according to the present disclosure, and the Y capacitors Cy21 and Cy22 correspond to second capacitors according to the present disclosure.

Two input terminals of the common mode choke coil CMCC are electrically connected to a positive terminal and a negative terminal of the input parts Pin1 and Pin2, respectively, and two output terminals of the common mode choke coil CMCC are electrically connected to a positive terminal and a negative terminal of the input capacitor Ci, respectively.

Figure 2:
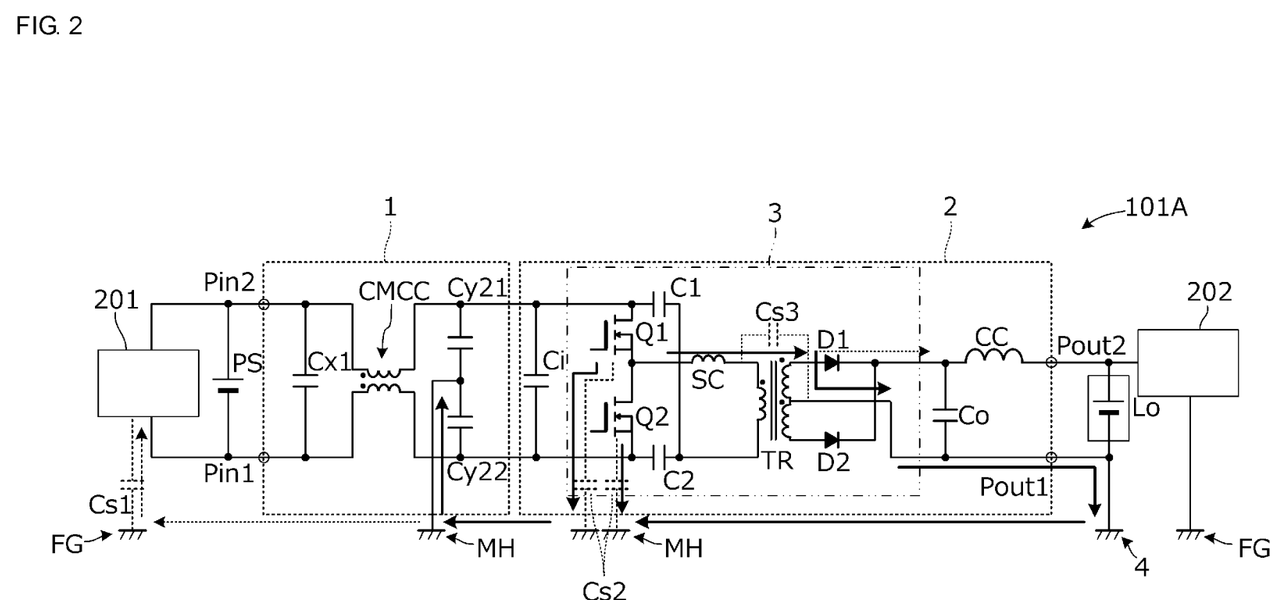
FIG. 2 is a diagram illustrating a path of a noise current that flows in the switching power supply device according to the first embodiment.
Figure 7:
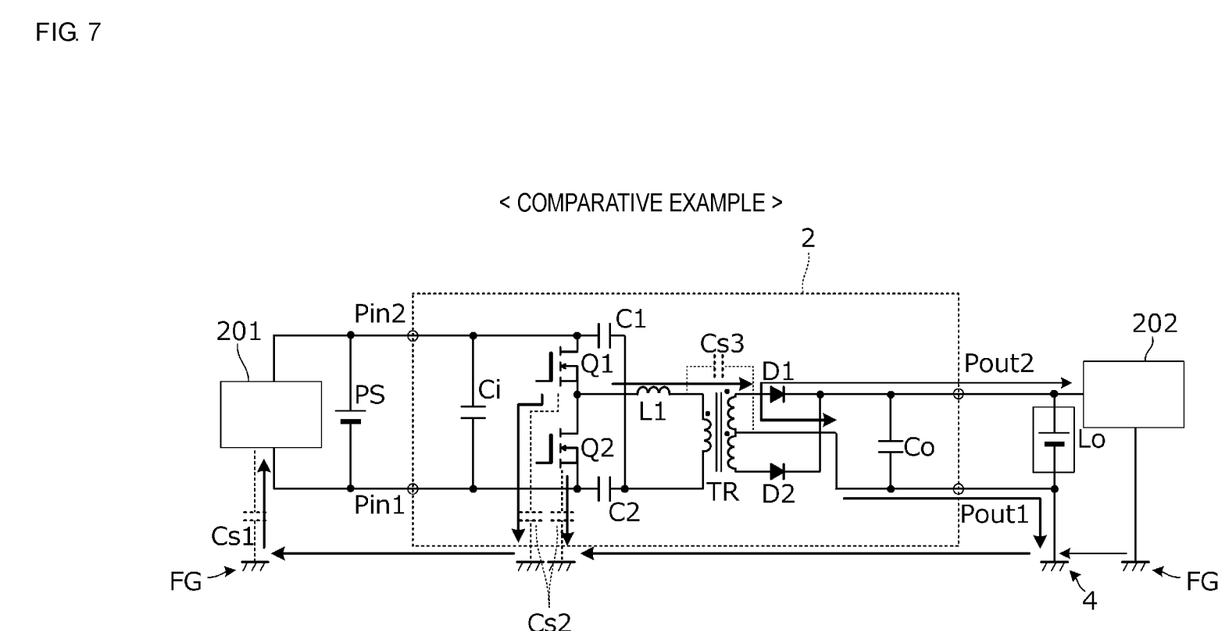
FIG. 7 is a diagram illustrating a path of a noise current that flows in a switching power supply device that serves as a comparative example.

Next, the working of the noise reducing circuit is described. FIG. 2 is a diagram illustrating a path of a noise current that flows in the switching power supply device 101A according to the first embodiment. FIG. 7 is a diagram illustrating a path of a noise current that flows in a switching power supply device that serves as a comparative example.

In both the circuits illustrated in FIG. 2 and FIG. 7, another electronic device 201 is connected to the direct-current input power supply PS to receive power supply from this direct-current input power supply PS. This another electronic device 201 is, for example, an inverter or a motor that operates at a high voltage. Further, in this example, a load Lo is a low voltage battery and is connected to another electronic device 202 that receives power supply from this low voltage battery or the switching power supply device 101A. This another electronic device 202 is, for example, a car navigation system or a wireless communication device that operates at a low voltage.

The switching power supply device is provided in the inside of a metal housing that is electrically continuous with a frame ground FG. The ground pattern 4 of the circuit board that makes up the switching power supply device 101A is electrically continuous with the frame ground FG via the metal housing.

A parasitic capacitance Cs1 is formed between another electronic device 201 and the frame ground FG, a parasitic capacitance Cs2 is formed between switching devices Q1 and Q2 and a metal housing MH, and a parasitic capacitance Cs3 is formed between a primary winding and a secondary winding of an isolation transformer TR.

As described above, another electronic device 201 is an inverter or a motor and is mounted on the frame ground FG with an insulator sheet interposed therebetween in such a manner as to be electrically insulated from and thermally conductive with the frame ground FG. The parasitic capacitance Cs1 is formed at part where this insulator sheet is interposed.

In the example illustrated in FIG. 2, the switching circuit 3 illustrated in FIG. 1 includes the switching devices Q1 and Q2, the isolation transformer TR, rectifying devices D1 and D2, capacitors C1 and C2, and a smoothing coil SC.

In order to dissipate generated heat to the metal housing MH and the frame ground FG, the switching devices Q1 and Q2 are thermally coupled with the metal housing MH with an insulator sheet interposed therebetween. The foregoing parasitic capacitance Cs2 is formed at part where this insulator sheet is interposed.

In the comparative example illustrated in FIG. 7, a common mode noise current from the switching devices Q1 and Q2, which are noise generating sources, flows to another electronic device 202 via the parasitic capacitance Cs3. This causes electromagnetic interference in another electronic device 202. Further, a common mode noise current from the switching devices Q1 and Q2 flows to another electronic device 201 via the parasitic capacitances Cs3 and Cs1 and the frame ground FG. Moreover, common mode noise currents from the switching devices Q1 and Q2 flows to another electronic device 201 via the parasitic capacitances Cs2 and Cs1 and the frame ground FG. This causes electromagnetic interference in another electronic device 201. Further, a radio frequency magnetic field is generated due to the common mode noise current flowing in the frame ground, and electromagnetic noise is radiated from the mobile object to the outside thereof. This causes electromagnetic interference in an external mobile object or an external electronic device.

Further, in the paths of the common mode noise current, there is joule loss caused by the flow of the common mode noise current. Therefore, this loss reduces the power conversion efficiency accordingly.

On the other hand, as illustrated in FIG. 2, in the switching power supply device 101A according to the present embodiment, the choke coil CC is provided in the current path between the output smoothing capacitor Co and an output part Pout2. The impedance of the current path that goes through this choke coil CC is high. Therefore, it is difficult for the common mode noise current to go through this current path, and the noise current that reaches the positive terminal of the output part Pout2 is suppressed. This prevents electromagnetic interference in another electronic device 202.

The self-resonant frequency of the choke coil CC is, for example, a frequency equal to or higher than 0.53 MHz and equal to or lower than 108 MHz (i.e., from 0.53 MHz to 108 MHz). Therefore, the impedance of the current path for the common mode noise current is particularly high in a frequency band of the foregoing self-resonant frequency, and thus, the noise current that reaches the positive terminal of the output part Pout2 is suppressed effectively.

Further, as illustrated in FIG. 2, the ground pattern 4 is connected to the output smoothing capacitor Co in such a way that the ground pattern 4 and one end portion of the output smoothing capacitor Co have the same potential. Because of a current route that goes through a connecting part of the ground pattern 4 and the one end portion of the output smoothing capacitor Co, a noise balanced circuit is formed. As will be described below, the noise balanced circuit is a closed circuit for a noise current of noise (common mode noise) generated by switching operation of the switching devices Q1 and Q2. Because of this, a common mode noise current from the switching devices Q1 and Q2, which are noise generating sources, returns via the parasitic capacitance Cs3, the metal housing MH, and the Y capacitors Cy21 and Cy22. Further, common mode noise currents from the switching devices Q1 and Q2 return via the parasitic capacitance Cs2, the metal housing MH, and the Y capacitors Cy21 and Cy22. This prevents the noise currents from reaching the input parts Pin1 and Pin2 and prevents electromagnetic interference in another electronic device 201.

Note that the choke coil CC is not a device for removing the common mode noise but for just making the noise current difficult to flow in the current path between the output smoothing capacitor Co and the output part Pout2. Thus, even in the case where the choke coil CC has a low impedance, there will still be an effect. This makes it possible to reduce (not necessary to increase) the number of turns in the coil, and a decrease of the power loss due to copper loss caused by the winding of the coil can also be suppressed. Therefore, the decrease in power conversion efficiency can be suppressed.

On the other hand, because the total amount of the common mode noise current remains nearly the same, the common mode noise current flowing in the negative terminal side of the output part Pout, which is a low impedance path, increases. Therefore, it is preferable not to provide a capacitor for smoothing between the choke coil CC and the load Lo. This is because, in the case where the capacitor for smoothing is provided, the noise currents in the positive terminal and the negative terminal of the output part Pout are smoothed, and this increases the noise current flowing to the positive terminal of the output part.

The common mode choke coil CMCC is provided between the X capacitor Cx1 and the Y capacitors Cy21 and Cy22, and thus, the common mode noise current returning to the Y capacitors Cy21 and Cy22 does not flow to the side of the input parts Pin1 and Pin2 via the common mode choke coil CMCC. The self-resonant frequency of the common mode choke coil CMCC is, for example, a frequency equal to or higher than 0.53 MHz and equal to or lower than 108 MHz (i.e., from 0.53 MHz to 108 MHz). Therefore, the impedance of the common mode noise current is high in a frequency band of the foregoing self-resonant frequency, and particularly, the common mode noise current in this frequency band does not return to the input parts Pin1 and Pin2 via the common mode choke coil CMCC.

Figure 3:
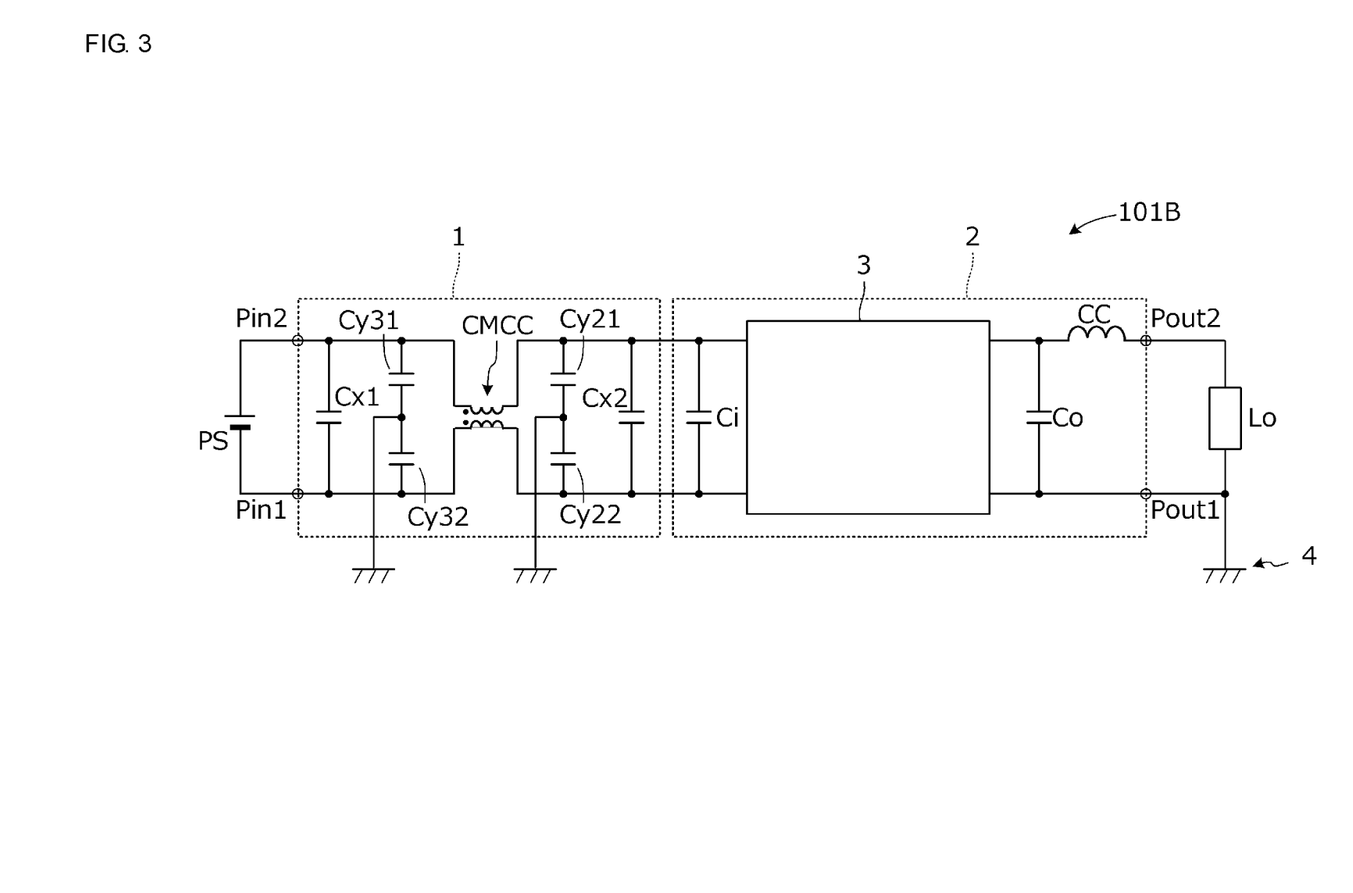
FIG. 3 is a circuit diagram of another switching power supply device according to the first embodiment.

FIG. 3 is a circuit diagram of another switching power supply device 101B according to the first embodiment. The switching power supply device 101B includes input parts Pin1 and Pin2 for a direct-current input power supply PS, a DC-DC converter 2, a noise reducing circuit 1, and a circuit board on which a ground pattern 4 is provided. The switching power supply device 101B includes Y capacitors Cy31 and Cy32 that are respectively electrically connected between two end portions of the X capacitor Cx1 and the ground pattern 4. These Y capacitors Cy31 and Cy32 correspond to third capacitors according to the present disclosure. Further, the switching power supply device 101B includes an X capacitor Cx2 connected in parallel to the input capacitor Ci. This X capacitor Cx2 corresponds to a fourth capacitor according to the present disclosure. The other configurations are similar to those of the switching power supply device 101A illustrated in FIG. 1. As described above, the inclusion of the X capacitor Cx2 that follows the common mode choke coil CMCC produces actions and effects that normal mode noise generated in the switching circuit is reduced. Further, the inclusion of the Y capacitors Cy31 and Cy32 that precedes the common mode choke coil CMCC produces actions and effects that improves the noise attenuation ratio of the noise reducing circuit and reduces common mode noise generated in the switching circuit.

Figure 4:
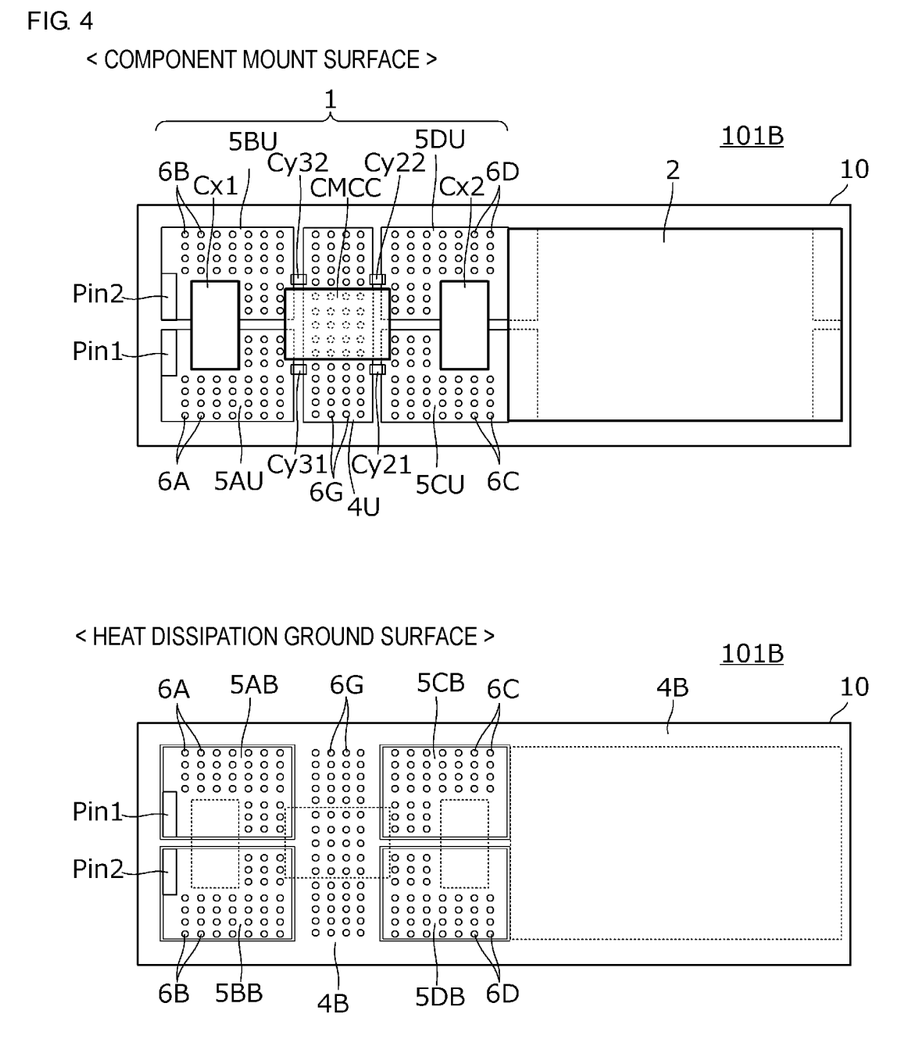
FIG. 4 illustrates plan views of a circuit board 10 on which the switching power supply device is formed.

FIG. 4 illustrates plan views of a circuit board 10 on which the switching power supply device 101B is formed. The circuit board 10 has a component mount surface on which components are mounted and a heat dissipation ground surface on which the ground pattern and a heat dissipation conductor pattern are formed. The upper part of FIG. 4 is a plan view of the component mount surface of the switching power supply device 101B, and the lower part of FIG. 4 is a plan view of the heat dissipation ground surface of the switching power supply device 101B.

The noise reducing circuit 1 is provided between the input parts Pin1 and Pin2 and the input capacitor Ci. Although it is not illustrated, the input capacitor Ci is arranged at an end portion of the DC-DC converter 2 on the input parts Pin1 and Pin2 side. On the circuit board, the input parts Pin1 and Pin2 to the DC-DC converter 2 are arranged in a linear fashion.

On the component mount surface of the circuit board 10, a positive terminal circuit pattern 5AU and a negative terminal circuit pattern 5BU that supply currents from the input parts Pin1 and Pin2 to two input terminals of the common mode choke coil CMCC are formed. The positive terminal circuit pattern 5AU and the negative terminal circuit pattern 5BU are positioned in parallel and close to each other. The positive terminal circuit pattern 5AU and the negative terminal circuit pattern 5BU also serve as heat dissipation conductor patterns on the component mount surface, which will be described later.

On the component mount surface of the circuit board 10, a component mount surface side ground pattern 4U arranged below the common mode choke coil CMCC is formed.

On the component mount surface of the circuit board 10, a positive terminal circuit pattern 5CU and a negative terminal circuit pattern 5DU that connect two output terminals of the common mode choke coil CMCC, the Y capacitors Cy21 and Cy22, the X capacitor Cx2, and the input capacitor Ci of the DC-DC converter 2 are formed. The positive terminal circuit pattern 5CU and the negative terminal circuit pattern 5DU are positioned in parallel and close to each other. The positive terminal circuit pattern 5CU and the negative terminal circuit pattern 5DU also serve as heat dissipation conductor patterns on the component mount surface, which will be described later.

On the component mount surface of the circuit board 10, the common mode choke coil CMCC of surface mount type, the X capacitors Cx1 and Cx2, the Y capacitors Cy21, Cy22, Cy31, and Cy32 are mounted.

The component mount surface side ground pattern 4U is electrically and thermally connected to a heat dissipation ground surface side ground pattern 4B via through-hole conductors 6G.

The heat dissipation conductor patterns 5AU, 5BU, 5CU, and 5DU are formed on the component mount surface of the circuit board 10, and heat dissipation conductor patterns 5AB, 5BB, 5CB, and 5DB are formed on the heat dissipation ground surface of the circuit board 10. The heat dissipation conductor patterns 5AU, 5BU, 5CU, and 5DU are electrically and thermally connected to the heat dissipation conductor patterns 5AB, 5BB, 5CB, and 5DB via through-hole conductors 6A, 6B, 6C, and 6D, respectively.

The mount area of the heat dissipation conductor patterns 5AU, 5BU, 5CU, and 5DU and the heat dissipation conductor patterns 5AB, 5BB, 5CB, and 5DB are twice the mount area of the common mode choke coil CMCC or greater. Therefore, compared with the state where only the common mode choke coil CMCC is present, the heat dissipation efficiency of the common mode choke coil CMCC is extremely high.

The heat dissipation ground surface side ground pattern 4B is electrically insulated from the heat dissipation conductor patterns 5AB, 5BB, 5CB, and 5DB.

One of the output terminals of two output terminals of the common mode choke coil CMCC is electrically connected to one terminal of the Y capacitor Cy21 via the heat dissipation conductor pattern 5AU. Further, the other of the output terminals of the common mode choke coil CMCC is electrically connected to one terminal of the Y capacitor Cy22 via the heat dissipation conductor pattern 5BU.

One of the input terminals of two input terminals of the common mode choke coil CMCC is electrically connected to one terminal of the Y capacitor Cy31 via the heat dissipation conductor pattern 5CU. Further, the other of the input terminals of the common mode choke coil CMCC is electrically connected to one terminal of the Y capacitor Cy32 via the heat dissipation conductor pattern 5DU.

According to the configuration described above, the noise balanced circuit is made up of the noise reducing circuit 1 and the ground pattern 4, and this noise balanced circuit suppresses the common mode noise generated by switching operation of the switching devices. Further, the heat generated by the common mode choke coil CMCC is effectively dissipated through the component mount surface side ground pattern 4U, a plurality of the through-hole conductors 6G, and the heat dissipation ground surface side ground pattern 4B. Moreover, the heat generated by the common mode choke coil CMCC is more effectively dissipated through the heat dissipation conductor patterns 5AU and 5BU, a plurality of the through-hole conductors 6A and 6B, the heat dissipation conductor patterns 5AB and 5BB, the heat dissipation conductor patterns 5CU and 5DU, a plurality of the through-hole conductors 6C and 6D, and the heat dissipation conductor patterns 5CB and 5DB.

Second Embodiment

In the second embodiment, an example of the switching power supply device is illustrated, which is different from the example illustrated in the first embodiment in the configuration of the DC-DC converter 2.

Figure 5:
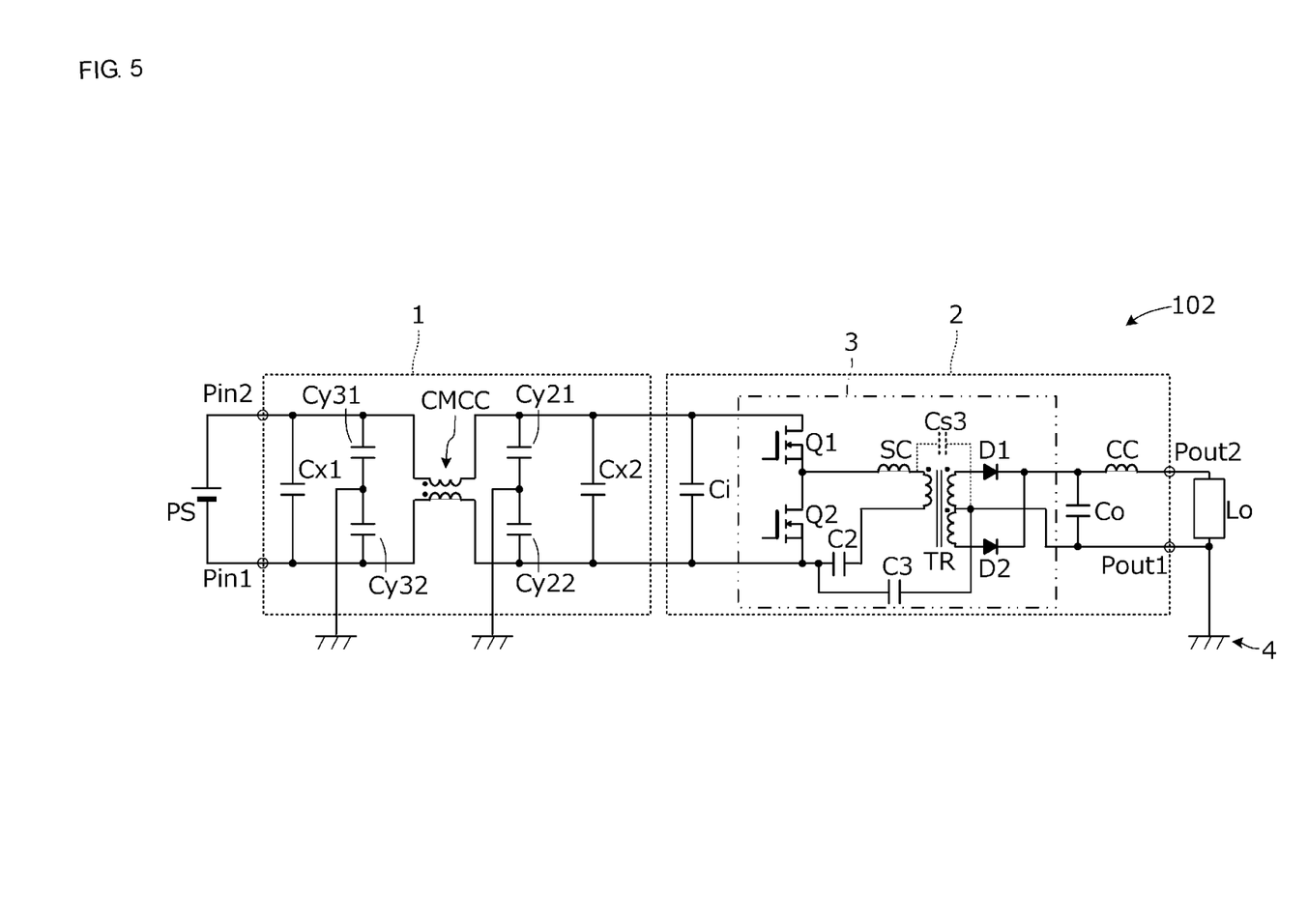
FIG. 5 is a circuit diagram of a switching power supply device according to a second embodiment.

FIG. 5 is a circuit diagram of a switching power supply device 102 according to the second embodiment. The switching power supply device 102 includes input parts Pin1 and Pin2 for a direct-current input power supply PS, a DC-DC converter 2, a noise reducing circuit 1, and a circuit board on which a ground pattern 4 is provided.

The DC-DC converter 2 includes an input capacitor Ci, a switching circuit 3, an output smoothing capacitor Co, and a choke coil CC. A switching circuit 3 includes switching devices Q1 and Q2, an isolation transformer TR, rectifying devices D1 and D2, capacitors C2 and C3, and a smoothing coil SC.

The other configurations are similar to those of the switching power supply device 101B illustrated in FIG. 3. As described above, by providing the smoothing coil SC on the primary side of the isolation transformer TR, a switching current is smoothed, and a noise component thereof is suppressed. Further, by connecting the capacitor C3 between the mid-point of the secondary side of the isolation transformer TR and a negative terminal input part of the DC-DC converter and allowing the common mode noise current to return to the switching circuit via the parasitic capacitance Cs3 formed between the primary winding and the secondary winding of the isolation transformer TR, the noise balanced circuit is formed, and this noise balanced circuit suppresses the generation of common mode noise caused by switching operation of the switching devices with a high degree of efficiency.

Note that in the examples illustrated in the above, a single surface mount type common mode choke coil CMCC is included between the X capacitor Cx1 and the input capacitor Ci. However, a plurality of surface mount type common mode choke coils may alternatively be included. For example, an additional common mode choke coil may be provided between the X capacitor Cx2 and the input capacitor Ci. Further, a common mode choke coil may alternatively be provided between the Y capacitors Cy21 and Cy22 and the X capacitor Cx2.

Third Embodiment

In the third embodiment, an example of a mobile object that includes a switching power supply device is illustrated.

Figure 6:
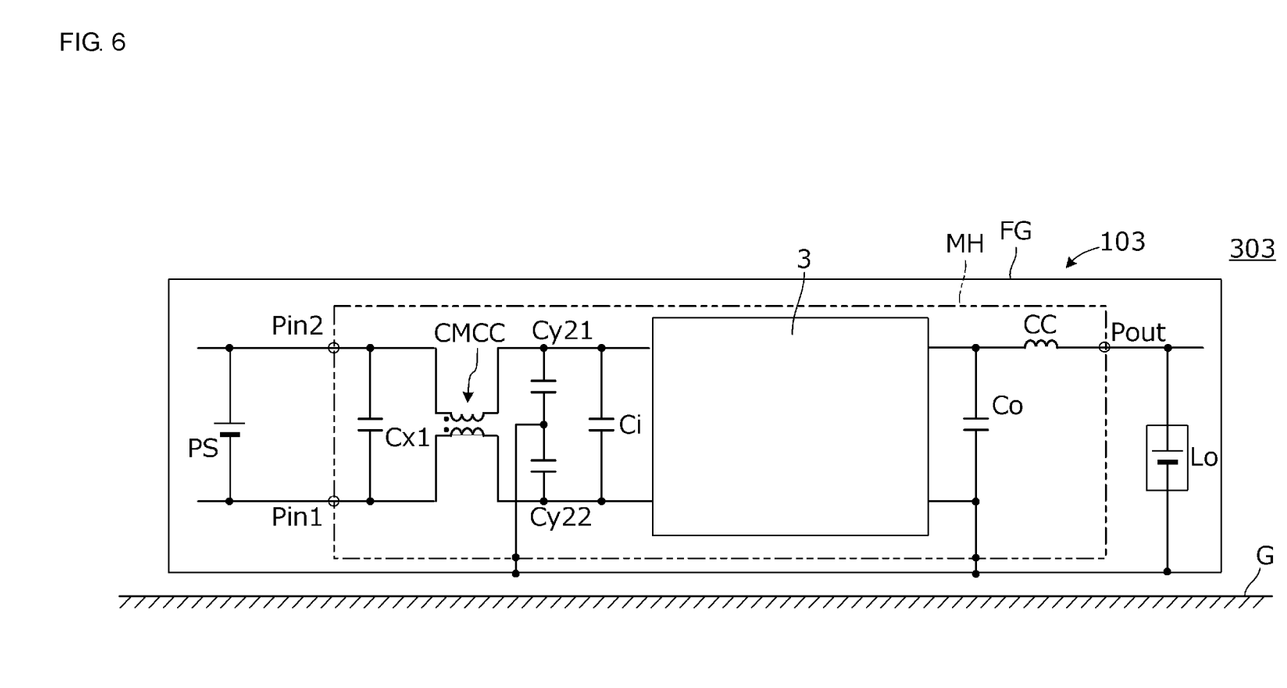
FIG. 6 is a circuit diagram of a switching power supply device according to a third embodiment and a mobile object including the switching power supply device.

FIG. 6 is a circuit diagram of a switching power supply device 103 according to the third embodiment and a mobile object 303 including the switching power supply device 103.

The switching power supply device 103 is a power supply device mounted in the mobile object 303 having a frame ground FG that is electrically insulated from an earth ground (earth) G. The configuration of this switching power supply device 103 is similar to that of the switching power supply device illustrated in the first or second embodiment.

The mobile object 303 is an electric vehicle such as, for example, a HV (hybrid vehicle), an EV (electric vehicle), a PHV (plug-in hybrid vehicle), a FCV (fuel cell vehicle), or the like. The frame ground FG is a chassis of such an electric vehicle. The frame ground FG of the mobile object 303 is electrically insulated from the earth ground (earth) G by rubber tires.

The switching power supply device 103 converts a power input to the input parts Pin1 and Pin2 into a power to output to the output part Pout. The switching power supply device 103 is formed in the inside of a metal housing MH, and the metal housing MH is electrically continuous with the frame ground FG. The input parts Pin1 and Pin2 for the direct current input power supply PS is electrically insulated from the metal housing MH, and a negative terminal of the output part is electrically connected to the metal housing MH and the frame ground FG.

Another electronic device is connected to the direct-current input power supply PS, and this another electronic device receives power supply from this direct-current input power supply PS and operates at a high voltage. This another electronic device is, for example, an inverter or a motor. Further, a load Lo is a low voltage battery and receives power supply from this low voltage battery or the switching power supply device 103. This another electronic device is, for example, a car navigation system or a wireless communication device that operates at a low voltage.

As described above, the switching power supply device according to the present disclosure can be used for a switching power supply device mounted in the mobile object having the frame ground that is electrically insulated from the earth ground.

Finally, the present disclosure is not limited to the embodiments described above. For a person skilled in the art, modifications and alterations are possible if appropriate. The scope of the present disclosure is described by the claims and not by the foregoing embodiments. Moreover, variations and alterations of the embodiments, which come within the scope of the claims and the range of equivalency of the claims, are included in the scope of the present disclosure.

What is claimed is:

1. A switching power supply device comprising:
   an input configured to connect to a direct-current input power supply;
   a DC-DC converter including an input capacitor, a switching device, an isolation transformer, a rectifying device, and an output smoothing capacitor;
   a noise reducing circuit; and
   a circuit board including a ground pattern, wherein
   the noise reducing circuit includes a first capacitor connected in parallel to the input, a surface mount type common mode choke coil connected between the first capacitor and the input capacitor, second capacitors respectively electrically connected between two end portions of the input capacitor and the ground pattern, and an output filter having the output smoothing capacitor,
   a noise balanced circuit configured to receive noise generated by switching operation of the switching device, the noise balanced circuit including a closed circuit of a noise current, the closed circuit including the noise reducing circuit and the ground pattern,
   the noise reducing circuit is between the input and the input capacitor, and the input to the DC-DC converter are configured in a linear fashion on the circuit board,
   two input terminals of the common mode choke coil are respectively electrically connected to a positive terminal and a negative terminal of the input,
   two output terminals of the common mode choke coil are respectively electrically connected to a positive terminal and a negative terminal of the input capacitor,
   the circuit board includes a component mount surface on which a component is mounted, a heat dissipation ground surface on which the ground pattern and a plurality of heat dissipation conductor patterns are configured, and through-hole conductors between the component mount surface and the heat dissipation ground surface,
   the circuit board includes a positive terminal circuit pattern and a negative terminal circuit pattern that are on the component mount surface and respectively configured to cause currents to flow from the input to the two input terminals of the common mode choke coil,
   the positive terminal circuit pattern and the negative terminal circuit pattern are configured in parallel and close to one another,
   the component mount surface of the circuit board includes a component mount surface side ground pattern below the common mode choke coil,
   the component mount surface side ground pattern is electrically and thermally connected to the ground pattern by the through-hole conductor,
   the ground pattern is electrically insulated from the heat dissipation conductor patterns, and
   the two input terminals of the common mode choke coil are respectively electrically connected to the heat dissipation conductor patterns by the through-hole conductors, and the two output terminals of the common mode choke coil are respectively electrically connected to the heat dissipation conductor patterns by the through-hole conductors.

2. The switching power supply device according to claim 1, wherein
   the noise balanced circuit is configured to suppress generation of noise by cancelling out common mode noise generated by switching operation of the switching device, and the ground pattern and the heat dissipation conductor patterns are configured to dissipate heat generated by the common mode choke coil through the through-hole conductors.

3. The switching power supply device according to claim 2, wherein
   the output filter includes the output smoothing capacitor and a choke coil in a current path to an output.

4. The switching power supply device according to claim 2, wherein
   a total area of the heat dissipation conductor patterns is twice a mount area of the common mode choke coil or greater.

5. The switching power supply device according to claim 2, wherein
   the ground pattern is connected to one end portion of the output smoothing capacitor such that the ground pattern and the one end portion of the output smoothing capacitor have a same potential.

6. The switching power supply device according to claim 2, further comprising:
a metal housing connected to the ground pattern such that the metal housing and the ground pattern have a same potential.

7. The switching power supply device according to claim 2, further comprising:
a fourth capacitor connected in parallel to the input capacitor.

8. The switching power supply device according to claim 2, further comprising:
third capacitors respectively electrically connected between two end portions of the input capacitor and the ground pattern, the third capacitors being between the common mode choke coil and the input capacitor.

9. The switching power supply device according to claim 2, wherein
the common mode choke coil includes a plurality of common mode choke coils.

10. The switching power supply device according to claim 2, wherein
the switching power supply device is configured to mounted in a mobile object that has a frame ground electrically insulated from earth ground, and
the switching power supply device further comprises:
a metal housing that houses the circuit board and is electrically continuous with the frame ground when the switching power supply device is mounted in the mobile object, and the ground pattern of the circuit board is electrically continuous with the metal housing.

11. The switching power supply device according to claim 1, wherein
the output filter includes the output smoothing capacitor and a choke coil in a current path to an output.

12. The switching power supply device according to claim 11, wherein
a total area of the heat dissipation conductor patterns is twice a mount area of the common mode choke coil or greater.

13. The switching power supply device according to claim 11, wherein
the ground pattern is connected to one end portion of the output smoothing capacitor such that the ground pattern and the one end portion of the output smoothing capacitor have a same potential.

14. The switching power supply device according to claim 1, wherein
a total area of the heat dissipation conductor patterns is twice a mount area of the common mode choke coil or greater.

15. The switching power supply device according to claim 1, wherein
the ground pattern is connected to one end portion of the output smoothing capacitor such that the ground pattern and the one end portion of the output smoothing capacitor have a same potential.

16. The switching power supply device according to claim 1, further comprising:
a metal housing connected to the ground pattern such that the metal housing and the ground pattern have a same potential.

17. The switching power supply device according to claim 1, further comprising:
a fourth capacitor connected in parallel to the input capacitor.

18. The switching power supply device according to claim 1, further comprising:
third capacitors respectively electrically connected between two end portions of the input capacitor and the ground pattern, the third capacitors being between the common mode choke coil and the input capacitor.

19. The switching power supply device according to claim 1, wherein
the common mode choke coil includes a plurality of common mode choke coils.

20. The switching power supply device according to claim 1, wherein
the switching power supply device is configured to mounted in a mobile object that has a frame ground electrically insulated from earth ground, and
the switching power supply device further comprises:
a metal housing that houses the circuit board and is electrically continuous with the frame ground when the switching power supply device is mounted in the mobile object, and the ground pattern of the circuit board is electrically continuous with the metal housing.

\* \* \* \* \*